(12) United States Patent
Suzuki

(10) Patent No.: US 7,092,301 B2
(45) Date of Patent: Aug. 15, 2006

(54) CONTROLLER AND METHOD FOR WRITING DATA

(75) Inventor: Takayuki Suzuki, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 118 days.

(21) Appl. No.: 10/852,019

(22) Filed: May 24, 2004

(65) Prior Publication Data
US 2004/0264261 A1 Dec. 30, 2004

(30) Foreign Application Priority Data
Jun. 26, 2003 (JP) ............... 2003-182418
Jan. 8, 2004 (JP) ............... 2004-003081

(51) Int. Cl.
G11C 7/00 (2006.01)
(52) U.S. Cl. .............. 365/189.12; 365/78; 365/185.33; 711/103; 711/109; 711/154
(58) Field of Classification Search ........... 365/189.12, 365/52, 78, 185.33; 711/154, 103, 109
See application file for complete search history.

(56) References Cited
U.S. PATENT DOCUMENTS
5,920,884 A * 7/1999 Jennings et al. ............ 711/102
5,968,141 A    10/1999 Tsai
6,434,034 B1 * 8/2002 Wallace et al. ............... 365/52
6,434,659 B1 * 8/2002 Mukai et al. ............... 711/103
6,507,881 B1   1/2003 Chen
2005/0027950 A1 * 2/2005 Suzuki ...................... 711/154

FOREIGN PATENT DOCUMENTS
WO    WO 98/59296    12/1998

OTHER PUBLICATIONS
Patent Abstracts of Japan, Publication No. 05-081012, Publication Date: Apr. 2, 1993, Title: "Firmware Rewrite System for Information Processor".

* cited by examiner

Primary Examiner—Anh Phung
Assistant Examiner—Toan Le
(74) Attorney, Agent, or Firm—Fish & Richardson P.C.

(57) ABSTRACT

The present invention provides a controller that can write an operation program for a control circuit to a memory and a method for writing data, while suppressing an increase in circuit area and an increase in manufacturing cost. An ATA register is connected to a host computer. A flash ROM access register is connected to the ATA register. When a special command code 80h is sent to the ATA register from the host computer, data (a command and microcomputer control software) sent from the host computer is sent via the ATA register. A decoder decodes the data sent to the flash ROM access register and generates a format, an address, and data for writing the microcomputer control software to the flash ROM.

11 Claims, 4 Drawing Sheets

Fig. 3

| Command Sequence | Bus Write Cycle | 1st Bus | | 2nd Bus | | 3rd Bus | | 4th Bus | | 5th Bus | | 6th Bus | |
|---|---|---|---|---|---|---|---|---|---|---|---|---|---|
| | | Address | Data | Address | Data | Address | Data | Address | Data | Address | Data | Address | Data |
| Read | 1 | XXXh | F0h | RA | RD | | | | | | | | |
| Read | 3 | 555h | AAh | 2AAh | 55h | 555h | F0h | RA | RD | | | | |
| Write | 4 | 555h | AAh | 2AAh | 55h | 555h | A0h | PA | PD | | | | |
| Erase Sector | 6 | 555h | AAh | 2AAh | 55h | 555h | 80h | 555h | AAh | 2AAh | 55h | SA | 30h |

- Address data is hexadecimal
- XXXh represents an arbitrary address
- Function of two types of read/reset commands are the same Address Data
RA: Read Address
RD: Read Data
PA: Write Address
PD: Write Data
SA: Sector Address

CONTROLLER AND METHOD FOR WRITING DATA

CROSS-REFERENCE TO RELATED APPLICATIONS

This application is based upon and claims the benefit of priority from prior Japanese Patent Application No. 2003-182418, filed on Jun. 26, 2003, and Japanese Patent Application No. 2004-003081, filed on Jan. 8, 2004, the entire contents of which are incorporated herein by reference.

BACKGROUND OF THE INVENTION

The present invention relates to a controller and a method for writing data.

Usually, peripheral equipment for a computer such as an optical disk drive includes a ROM (read-only memory) as a memory for storing a microcomputer operation program (hereinafter referred to as microcomputer control software) that is used for controlling each circuit. In recent years, usually, an electrically rewritable flash ROM that can rewrite data is used as this ROM. This is because the microcomputer control software must be updated in order to debug the microcomputer control software while the peripheral equipment is being developed or to perform updates (version upgrade) for improving functioning of the microcomputer control software.

Two types of software are written to a flash ROM, one is the aforementioned microcomputer control software for allowing a microcomputer to control each circuit and the other is an update program to be executed by the microcomputer to update the microcomputer control software. During normal operation of peripheral equipment, the microcomputer controls each circuit in accordance with the microcomputer control software written to the flash ROM. In contrast, during update of the microcomputer control software, the microcomputer rewrites the microcomputer control software recorded in the flash ROM in accordance with the update program written to the flash ROM.

The aforementioned description relates to an operation state in which microcomputer control software and an update program have been already written to the flash ROM. In a complete initial state, however, naturally, no data has been written to the flash ROM. That is, to allow a microcomputer to write the microcomputer control software to the flash ROM, at least the update program must have been already written to the flash ROM, but even this program has not been written in a complete initial state.

Consequently, conventionally, predetermined initial data (data containing at least an update program) is written to a flash ROM in a standalone state by commissioning flash ROM manufacturers or by using a ROM writer. A flash ROM chip, to which initial microcomputer control software is written, is subsequently mounted on a printed wiring board of the relevant peripheral equipment by soldering.

In the aforementioned method, because writing of the initial microcomputer control software is needed separately before the flash ROM chip is mounted on the peripheral equipment, the process becomes complicated and manufacturing cost inevitably increases.

Accordingly, in a prior art example different from the aforementioned method, a method is adopted for mounting a flash ROM chip without writing initial microcomputer control software and writing the microcomputer control software after it is mounted. Specifically, a mask ROM in which at least an update program is recorded in advance is incorporated and this mask ROM is connected to the microcomputer of the relevant peripheral equipment. Subsequently, when initial data is written to the flash ROM, the microcomputer is operated in accordance with a mask ROM program. The microcomputer communicates with a personal computer (PC) via an interface such as an ATA and an ATAPI or a SCSI and writes the microcomputer control software to the flash ROM.

This method, however, needs a mask ROM, which stores at least an update program but is not used for normal operations. Accordingly, the employment of the mask ROM, which is not necessary at all during normal operations, increases the chip area of a control chip (control integrated circuit).

SUMMARY OF THE INVENTION

One aspect of the present invention is a controller for use with a memory to perform predetermined control in response to an instruction from a host computer. The controller includes a first register for connection to the host computer and storing a command and data sent from the host computer. The command is in a first state or a second state. A second register for function expansion is connected to the first register and fetches data stored in the first register when the command stored in the first register is in the first state. A third register is connected to the first register and fetches the data stored in the first register when the command stored in the first register is in the second state. A decoder is connected to the third register and receives the data stored in the first register via the third register, performs a predetermined decoding process on the data, and provides the data to the memory when the command stored in the first register is in the second state. The data received in the decoder includes an operation program for the controller.

Another aspect of the present invention is a method for writing data, used by a controller to perform predetermined control, to a memory in response to an instruction from a host computer. The controller includes a first register that is connected to the host computer and stores a command and data sent from the host computer. The command is in a first state or a second state. A second register for function expansion is connected to the first register and fetches data stored in the first register when the command stored in the first register is in the first state. A third register is connected to the first register. A decoder is connected to the third register. The method includes providing the decoder with the data stored in the first register via the third register when the command stored in the first register is in the second state, performing a predetermined decoding process on the data with the decoder, and writing the decoded data to the memory. The data provided to the memory includes an operation program for the controller.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 3 is a table showing commands of a flash memory;

DESCRIPTION OF PREFERRED EMBODIMENTS

Figure 1:
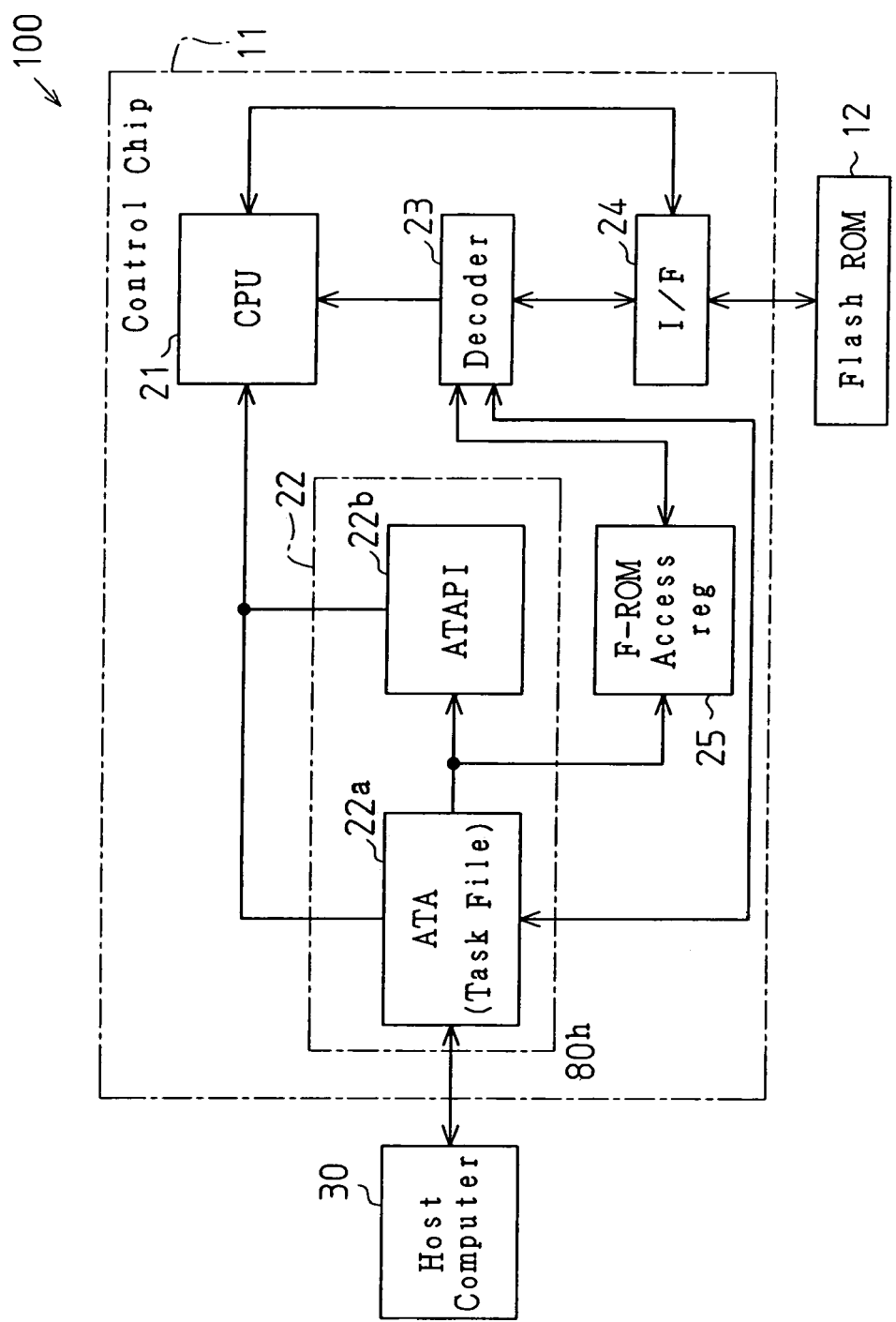
FIG. 1 is a schematic block diagram showing peripheral equipment including a control chip according to a preferred embodiment of the present invention.

In the drawings, like numerals are used for like elements throughout.

An embodiment in accordance with the present invention is described below with reference to FIG. 1.

FIG. 1 is a schematic block diagram showing computer peripheral equipment 100, for example, a CD-ROM drive. The peripheral equipment 100 has a control chip (control integrated circuit) 11 and a flash ROM 12. The control chip 11 incorporates a CPU 21, an interface 22, a decoder 23, an additional interface 24, and a flash ROM access register (hereinafter simply referred to as "access register") 25. The interface 22 includes an Advanced Technology Attachment (ATA) register 22a and an AT Attachment Packet Interface (ATAPI) register 22b. The ATA register 22a of the first interface 22 in the control chip 11 is connected to a host computer 30.

The ATA register 22a is an 8-byte register for mediating between signals (commands or read and write data) in accordance with an ATA standard that specifies the signal exchange between the host computer 30 and the peripheral equipment 100. The ATA register 22a, which includes a command register and a data register, writes data to, and reads data from, the host computer 30 and the CPU 21 in compliance with the ATA standard.

On the other hand, the ATAPI register 22b is a 12-byte register added for operating expanded functions from the standpoint of the standard, in order to enable access to peripheral equipment other than a hard disk drive. The host computer 30 can write 12-byte data to the ATAPI register 22b via the ATA register 22a by writing a command having code value A0h (hexadecimal) to the command register of the ATA register 22a. Hereinafter, when describing a code value, the code value of a command will be added to the command. For example, the command having code value A0h will be shown as command code A0h. That is, the command of the command code A0h is written to the command register of the ATA register 22a to set the destination of a signal of a data register to the ATAPI register 22b, and the 12-byte data immediately following the command code A0h is sent to the ATAPI register 22b.

The 12-byte data includes a command, which is decoded and executed by the CPU 21. Accordingly, the peripheral equipment 100 operates in accordance with the 12-byte data written to the ATAPI register 22b.

Because initial data (microcomputer control software and an update program) is not written to the flash ROM 12 immediately after the flash ROM is manufactured in a factory, the CPU 21 cannot perform any operations.

The writing of initial data to the flash ROM 12 in this embodiment is described below.

The interface 22 of the control chip 11 is connected to the host computer 30, which stores the initial data.

A write mode for the initial data is started when the host computer 30 sends a special command code having a predetermined code value (write mode setting command) to the ATA register 22a. The special command code sets a window for the access register 25 in the ATA register 22a and enables access of the access register 25 by the host computer 30. In the present embodiment, the special command code has a code value of 80h. In response to the special command, the interface 22 switches the operation mode from the normal mode to the write mode. Further, the interface 22 designates the flash ROM access register 25 as the destination for a maximum of 256-bytes of data sent subsequent to the special command.

The special command is a command that is not regulated by the ATA standard. That is, the special command is a vendor unique command. The ATA standard does not include a command having a code value in the range of 80h to 87h (hexadecimal). A vendor freely sets and uses a command having a command value in this range.

Specifically, the host computer 30 can write data to the access register 25, connected to the ATA register 22a, via the ATA register 22a by writing the command code 80h to the command register of the ATA register 22a. The data quantity of the access register 25 is allowed to be up to 256 bytes.

The data sent from the host computer 30 to the access register 25 via the ATA register 22a in this manner is decoded by the decoder 23. Consequently, the decoder 23 enables access to the flash ROM 12 via the interface 24 as a sequence, generates a control signal that writes predetermined write data to the predetermined write address, and then generates a control signal that causes the CPU 21 to sleep at the write operation. Thus, the decoder 23 can sequentially write predetermined data to the predetermined address of the flash ROM 12 without being hindered by the CPU 21.

When all of the write data (microcomputer control software) is written, the host computer 30 verifies the data written to the flash ROM 12 via the interface 24, the decoder 23, the access register 25, and the ATA register 22a. After the data is verified, the host computer 30 sends a command that terminates the writing of initial data to the ATA register 22a. Consequently, a path into the interface 24 of the decoder 23 and a path into the access register 25 of the ATA register 22a closes and the write mode terminates. At the same time, the sleeping state of the CPU 21 is released by the control of the decoder 23.

Figure 2:
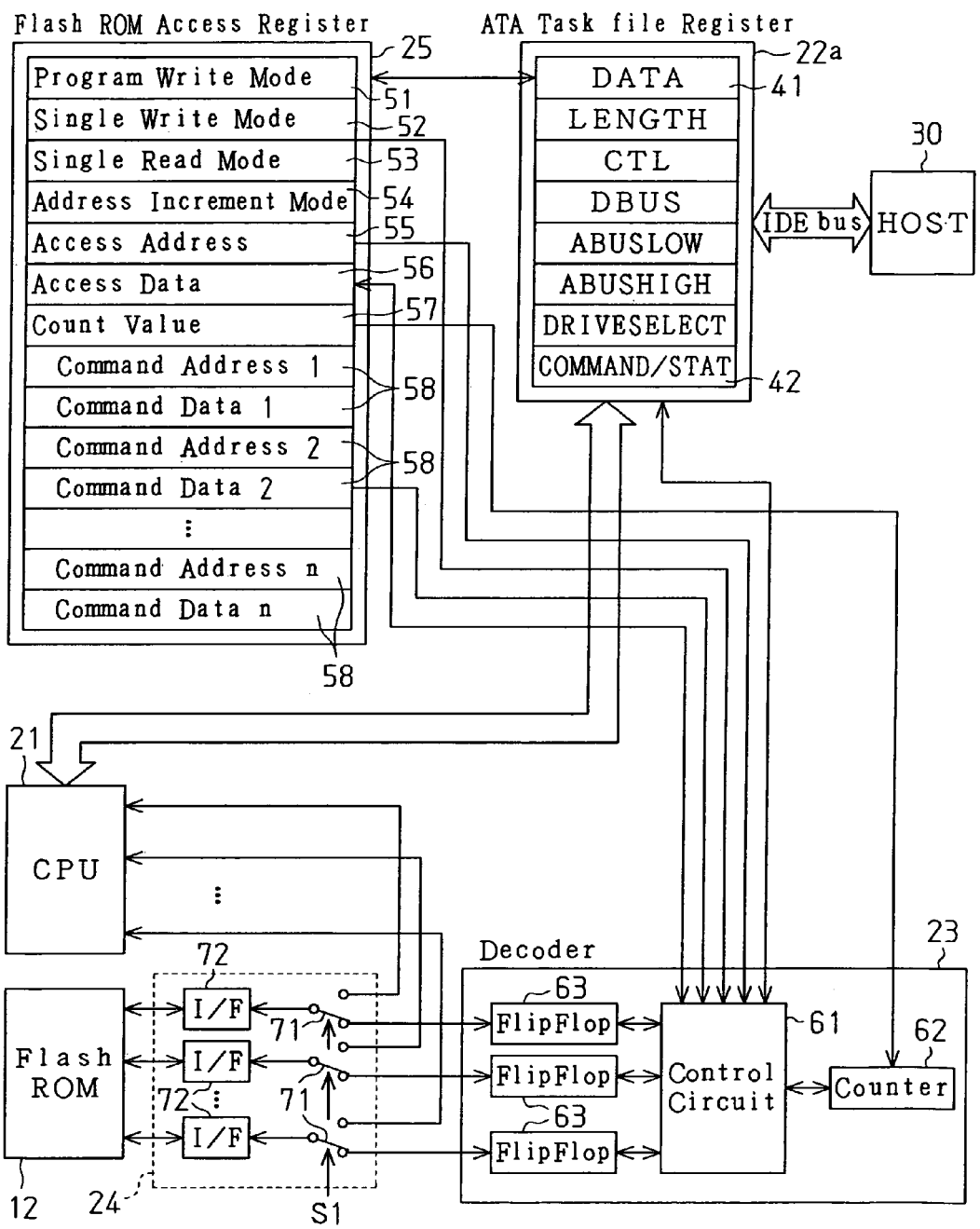
FIG. 2 is a schematic block diagram of the control chip of FIG. 1.

FIG. 2 is a schematic block diagram of the control chip 11.

The ATA register 22a includes a plurality of sections (registers). Each register is accessed to write data, set a value, or to read a status. The register 41 is a register for writing and reading data and is referred to as a data register. The register 42, which is a register for writing a command and reading a status, is referred to as a command register when writing a command and is referred to as a status register when reading a status. Although the command register and the status register are actually formed in different sections, the same address is accessed. Thus, when the host computer 30 writes data to this address, the data is written to the command register 42. When data is read from this address, the contents of the status register 42 are read.

The host computer 30 writes data for the peripheral equipment 100 to the data register 41 and reads data for the peripheral equipment 100 from the data register 41. The host computer 30 writes a command to the command register 42. The peripheral equipment 100 analyzes and executes the command written to the peripheral equipment 100. The host computer 30 reads the content of the status register 42 and determines the state of the peripheral equipment 100 based on the contents read.

The access register 25 includes a plurality of sections (registers) 51 to 58. Each register is accessed to set the operation mode or to write and read data. These accesses are performed via the data register 41 of the ATA register 22*a* during the write mode. That is, data provided from the host computer 30 is written to each of the registers 51 to 58 via the data register 41 of the ATA register 22*a*. Further, the data read from each of the registers 51 to 58 is provided to the host computer 30 via the data register 41.

A different operation mode is set for each of the registers 51 to 54. An operation mode for consecutively writing data is set for the register 51. An operation mode for writing a single piece of data is set for the register 52. An operation mode for reading a single piece of data is set for the register 53. An operation mode for automatically incrementing the accessed address is set for the register 54.

The register 55 functions as a register for storing the access address of the flash ROM 12 (access address register). Further, the register 56 functions as a register for writing data to that address or reading data from that address (access data register).

The cycle number (count value) required for accessing the flash ROM 12 is written to the register 57. The cycle number is set in the register 57 as a count value corresponding to the electrical characteristics of the flash ROM 12 and the frequency of the clock signal.

Due to a setup or hold time, the flash ROM 12 is accessed at predetermined time intervals. For example, when consecutively writing data to the flash ROM 12, a predetermined time must elapse from when a piece of data is written to the flash ROM 12 before writing the next piece of data. The predetermined time is determined by the electrical characteristics of the flash ROM 12.

The decoder 23 counts the number of pulses of a clock signal to measure the access time (wait time) for the flash ROM 12. The frequency of the clock signal may differ depending on the peripheral equipment to which the control chip 11 is mounted. Accordingly, the host computer 30 writes a count value, which corresponds to the electrical characteristics of the flash ROM 12 and the frequency of the clock signal, to the register 57. The decoder 23 measures the wait time based on the count value and accesses the flash ROM 12 in accordance with the measured wait time.

The register 58 is a register set having a plurality of sections for storing a command set that operates the flash ROM 12. A command for operating (mode switching) the flash ROM 12 is configured by plural bytes and is referred to as the command set. The command set is used to prevent noise or the data written to the flash ROM 12 in a normal mode, from being erroneously recognized as a command. The command set is configured by plural pairs of command addresses and command data. The number of pairs differs between commands.

Figure 4:
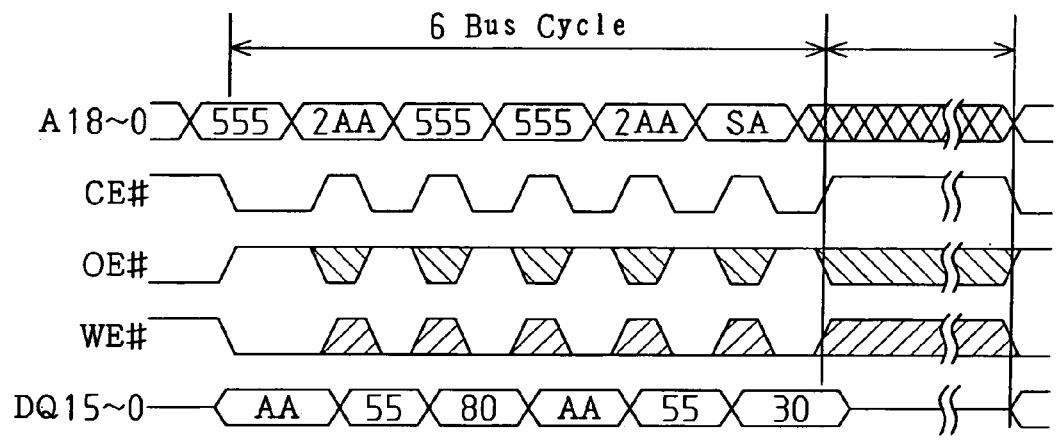
FIG. 4 is a timing chart of an erase operation performed by the flash memory.
Figure 5:
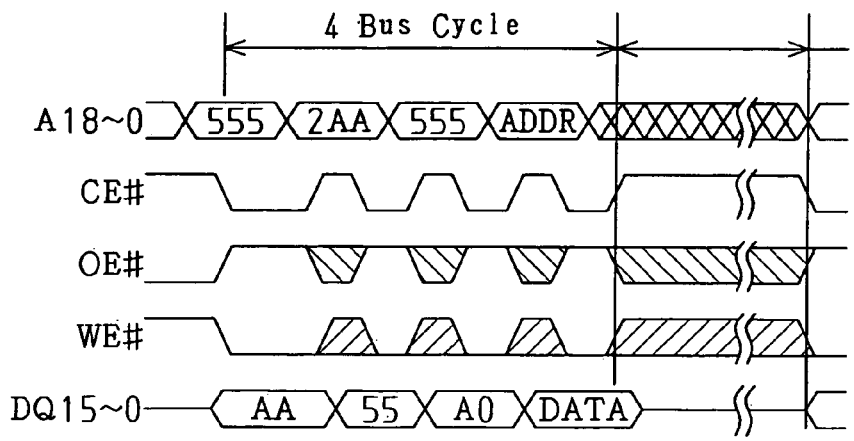
FIG. 5 is a timing chart of a program operation performed by the flash memory.

FIG. 3 shows a typical command set for a flash memory, and FIGS. 4 and 5 show the timing for providing the command set. Referring to FIG. 3, the flash ROM 12 is provided with a command configured by a predetermined address and data when data is erased from, written to, or read from the flash ROM 12. A certain number of cycles are required to provide the command, and the number of such cycles differs between commands.

Referring to FIG. 4, for example, during an erasing operation, a command address and command data for erasing data is sequentially provided during six cycles. The erasing is started based on the erase address (sector address) and data 30h provided in the sixth address.

Referring to FIG. 5, for example, during a write operation, a command address and command data for writing data is sequentially provided during four cycles. The write operation is started based on the write address and write data provided in the fourth address.

For example, the host computer 30 stores the command set shown in FIG. 3, as a command set configured by four pairs of command addresses and command data, in eight registers. The decoder 23 sequentially reads the address and data of each pair from the registers and provides the flash ROM 12 with the read addresses and data.

Referring to FIG. 2, the decoder 23 includes a control circuit 61, a counter 62, and a plurality of flip-flops 63. The control circuit 61 is connected to the counter 62. Further, the control circuit 61 is connected to the interface 24 via the flip-flops 63. Each of the flip-flops 63 holds a plurality of signals transferred between the control circuit 61 and the flash ROM 12.

The control circuit 61 operates based on the contents written to the access register 25, reads the program data written to the access register 25 from the host computer 30, and writes the program data to the flash ROM 12. Further, the control circuit 61 sets the count value (set value) written to the register 57 in the counter 62.

The counter 62 is, for example, an increment counter, and counts the number of pulses of a reference clock signal (not shown). The counter 62 provides the control circuit with a count-up signal having a predetermined value when the count value matches the set value of the control circuit 61 to reset the count value. In response to the count-up signal, the control circuit 61 performs the next access of the flash ROM 12.

The interface 24 includes a plurality of switch circuits 71, respectively corresponding to the flip-flops 63, and a plurality of interface (I/F) circuits 72, respectively corresponding to the switch circuits 71. The I/F circuits 72 and the switch circuits 71 correspond to signals transferred between the control circuit 61 and the flash ROM 12.

In accordance with the operation state of the control chip 11, the switch circuits 71 switch the connection between the flash ROM 12 and the CPU 21 and the connection between the flash ROM 12 and the decoder 23. The writing of a command to the ATA register 22*a* changes the operation state of the control chip 11. More specifically, the switch circuits 71 are operated to connect the flash ROM 12 to the CPU 21 during normal operation. In response to a control signal S1 generated in accordance with the write mode (i.e., the writing of the command code 80h to the command register 42 by the host computer 30), the switch circuits 71 connect the flash ROM 12 to the decoder 23. Further, in response to the control signal S1 generated when aborting the write mode (i.e., the writing of a predetermined command (in this case, 87h) to the command register 42 by the host computer 30), the switch circuits 71 connect the flash ROM 12 to the CPU 21.

The procedures for writing a program to the flash ROM 12 will now be discussed.

(1) The host computer 30 writes a command code, which has a predetermined value (80h) for starting the writing of the program to the command register 42 of the ATA register 22*a*. This opens a window for the access register 25 (enables the host computer 30 to access the access register 25 via the data register 41), and switches the connection of the flash ROM 12 and the CPU 21 to the connection of the flash ROM 12 and the decoder 23 with the switch circuits 71.

(2) The host computer 30 writes the data described below to the corresponding registers of the address register 25 via the data register 41 of the ATA register 22*a*.

(a) Data for selecting a program write mode is written to the register 51, and data for selecting an address increment mode is written to the register 54.

(b) The count value is written to the register 57.

(c) An initial word command set for performing a writing operation on the flash ROM 12 is written to the register 58.

(d) An access address is written to the register 55.

(3) The host computer 30 performs the following on a register of the address register 25 via the data register 41 of the ATA register 22a.

(e) Write access data.

(4) In response to the writing of the access data, the control circuit 61 of the decoder 23 reads the mode setting value of the access register 25. Since the program write mode is selected, the control circuit 61 sequentially reads the initial work command set for performing a writing operation on the flash ROM 12 and accesses the flash ROM 12 via the flip-flops 63 and the interface 72. In this state, for each access, the control circuit 61 waits for a time (predetermined period) that is obtained by the counter from the product of the clock signal cycle and the count value.

(5) The control circuit 61 reads access address and access data from the registers 55 and 56 to perform writing on the flash ROM 12. Then, the control circuit 61 accesses the flash ROM 12 via the flip-flop 63 and the interface 72.

(6) After the period during which data is written to the flash ROM 12 (the period required for providing the flash ROM 12 with a command set and for writing access data) elapses, the host computer 30 writes the access data of the next address to the register 56 of the access register 25 via the data register 41 of the ATA register 22a.

(7) In response to the writing of the access data, the control circuit 61 reads the mode setting value of the access register 25. Since the program write mode is selected, the control circuit 61 sequentially reads the initial work command set for performing a writing operation on the flash ROM 12 and accesses the flash ROM 12 via the flip-flops 63 and the interface 72. Since the address increment mode is selected, the control circuit 61 increments (+1) the access address of the register 55.

(8) The control circuit 61 reads access data for performing a write operation on the flash ROM 12 and accesses the flash ROM 12 at the incremented access address via the flip-flops 63 and the interface 72.

(9) The control circuit 61 repeats steps 6, 7, and 8 until completion of the writing of the entire program data.

(10) The host computer 30 writes a command code having a predetermined value (87h), which ends writing, to the command register 42 of the ATA register 22a. This closes the window of the access register 25 and switches the connection of the flash ROM 12 and the decoder 23 to the connection of the flash ROM 12 and the CPU 21.

In this manner, microcomputer control software (a control circuit operation program) for allowing the CPU 21 to control each circuit of peripheral equipment and an update program for allowing the CPU 21 to update the microcomputer control software are written to the flash ROM 12. Accordingly, the CPU 21 reads the microcomputer control software written to the flash ROM 12 via the interface 24 and controls each circuit in accordance with the software. For example, when the peripheral equipment 100 is a CD-ROM drive, the CD-ROM drive moves a pick-up for irradiating a laser on the predetermined position of an optical disk or reads out the data recorded on the optical disk by reading the reflected light of the laser. On the other hand, during the update of the microcomputer control software, the CPU 21 rewrites the data of the microcomputer control software in accordance with the update program.

As described above, according to this embodiment, the following advantages are obtained.

(1) In this embodiment, when the special command code 80h is sent from the host computer 30 to the ATA register 22a, the data sent from the host computer 30 is sent to the flash ROM access register 25 via the ATA register 22a. Subsequently, the data sent to the flash ROM access register 25 is decoded by the decoder 23 to generate a write address for writing data to the flash ROM 12 and write data. When the special command is sent to the ATA register 22a in this manner, the write address and write data are generated in the circuit configuration in which only provided are the ATA register 25 that stores data sent to the ATA register 22a and the decoder 23 that decodes the data, thereby enabling the writing of initial data to the flash ROM 12. That is, only a slight change in a circuit that is composed mainly of existing interfaces is necessary, but an increase in the circuit area of the control chip 11 can be suppressed as there is no need to provide a mask ROM for writing microcomputer control software. Moreover, because tasks such as writing in advance initial data in the flash ROM 12 in a standalone state and mounting the flash ROM 12 is unnecessary, an increase in a manufacturing cost can also be suppressed.

(2) In this embodiment, data (microcomputer control software) can be written to the flash ROM 12 using data processing (a command) set in the area that is not regulated by the ATM standard. Accordingly, circuit design load for writing the microcomputer control software can also be reduced. In particular, the host computer 30 and the control chip 11 can be connected in accordance with the existing standard and can reduce the load under which a dedicated interface is developed even when the initial data is written.

(3) In this embodiment, if a special command is sent to the ATA register 22a, the CPU 21 is made to sleep by the flash ROM access register 25 via the decoder 23. Consequently, the write processing of the microcomputer control software for the flash ROM 12 can be prevented from being hindered by the operation of the CPU 21.

(4) In this embodiment, because data is not recorded in advance in the flash ROM 12, for example, a ROM can be integrated in the control chip. In this case, the circuit area of the entire peripheral equipment can be reduced.

(5) In this embodiment, the flash ROM access register 25 connected to the ATA register 22a is provided as a dedicated register that will not be restricted by the standard as in the ATAPI register 22b. Accordingly, initial data can be written to the flash ROM 12 by the access register 25 making the most use of a data bus for the ATA register 22a. Accordingly, in the writing of microcomputer control software by the flash ROM access register 25, for example, the degree of freedom in expanding settable functions (commands) or the like can be increased.

For example, several bytes of a write command (a write address and write data for the write command), cycle time of the writing command, and an initial value of the write address that are required each time data is written to the flash ROM 12a are written in advance to the flash ROM access register 25. Subsequently, the decoder 23 generates the write command, incremented write address, and write data that are required each time the data is written by sending only the write data of the flash ROM 12 from the host computer 30 to the access register 25 via the ATM register 22a and writes the data to the flash ROM 12.

Accordingly, because the write command and address required each time the data is written need not be sent from the host computer 30 to the access register 25 via the ATA register 22a, initial data can be written to the flash ROM 12 at high speed.

In this case, the data write time per address to the flash ROM 12 is controlled by allowing the host computer 30 to send subsequent write data, awaiting only for the time the writing is performed sufficiently. Otherwise, the decoder 23 detects the write end of the flash ROM 12 using the toggle bit or by polling and notifies the host computer 30 of it via the ATA register 22a. Upon receipt of this notification, the host computer 30 sends the subsequent write data. Moreover, because unnecessary waiting time when the subsequent write data is sent from the host computer 30 to the ATA register 22a is reduced by using IORDY (not shown), or the ATA standard, the data is written to the flash ROM 12 at high speed.

It should be apparent to those skilled in the art that the present invention may be embodied in many other specific forms without departing from the spirit or scope of the invention. Particularly, it should be understood that the present invention may be embodied in the following forms.

As described previously, the flash ROM 12 can also be integrated in the control chip 11. In this case, the circuit area of the entire peripheral equipment can be reduced.

In addition, a flash ROM may be employed as a memory. If data can be written, another PROM (Programmable ROM) can also be employed.

Further, the ATA register 22 is employed as a register, but a register that conforms to another standard can also be employed. Even in this case, a special command that enables the same data processing can be set corresponding to the standard.

Also, peripheral equipment can be any type of equipment, as well as a CD-ROM drive, if the peripheral equipment can exchange data by connecting with a computer. For example, the peripheral equipment can be an optical disk drive such as an MD and a DVD-RAM, a magneto optical disk drive such as an MO or a magnetic disk drive, such as a hard disk. Further, the peripheral equipment is not limited to such as that for information recording. For example, the peripheral equipment can be also an output device such as a printer, a reader such as a scanner, or a communication device such as a MODEM or a LAN.

The present examples and embodiments are to be considered as illustrative and not restrictive, and the invention is not to be limited to the details given herein, but may be modified within the scope and equivalence of the appended claims.

What is claimed is:

1. A controller for use with a memory to perform predetermined control in response to an instruction from a host computer, the controller comprising:
    a first register for connection to the host computer and storing a command and data sent from the host computer, the command being in a first state or a second state;
    a second register for function expansion that is connected to the first register and fetches data stored in the first register when the command stored in the first register is in the first state;
    a third register that is connected to the first register and fetches the data stored in the first register when the command stored in the first register is in the second state; and
    a decoder that is connected to the third register and receives the data stored in the first register via the third register, performs a predetermined decoding process on the data, and provides the data to the memory when the command stored in the first register is in the second state, wherein the data received in the decoder includes an operation program for the controller.

2. The controller according to claim 1, further comprising:
    a control circuit, connected to the second register and the decoder, for performing a predetermined control in response to an instruction from the host computer, wherein the decoder causes the control circuit to sleep when the command stored in the first register is in the second state.

3. The controller according to claim 2, further comprising:
    an interface for connecting the control circuit and the memory when the command is in the first state and for connecting the decoder and the memory when the command is in the second state.

4. The controller according to claim 1, wherein the host computer provides the decoder via the first and third registers with a count value that regulates an interval for accessing the memory, the decoder accessing the memory in accordance with the count value.

5. The controller according to claim 1, wherein the command in the first state is a command complying with the ATA standard, and the command in the second state is a vendor unique command that does not comply with the ATA standard.

6. The controller according to claim 1, wherein the first register designates the third register as a destination for the command and data sent from the host computer when the command is in the second state.

7. A method for writing data, used by a controller to perform predetermined control, to a memory in response to an instruction from a host computer, wherein the controller includes a first register that is connected to the host computer and stores a command and data sent from the host computer, the command being in a first state or a second state, a second register for function expansion that is connected to the first register and fetches data stored in the first register when the command stored in the first register is in the first state, a third register that is connected to the first register, and a decoder that is connected to the third register, the method comprising:
    providing the decoder with the data stored in the first register via the third register when the command stored in the first register is in the second state;
    performing a predetermined decoding process on the data with the decoder; and
    writing the decoded data to the memory,
    wherein the data provided to the memory includes an operation program for the controller.

8. The method according to claim 7, wherein the controller further includes a control circuit, connected to the second register and the decoder, for performing a predetermined control in response to an instruction from the host computer, the method further comprising:
    causing the control circuit to sleep when the command stored in the first register is in the second state.

9. The method according to claim 8, further comprising:
    connecting the control circuit and the memory when the command is in the first state, and connecting the decoder and the memory when the command is in the second state.

10. The method according to claim 7, further comprising:
providing the decoder with a count value, for regulating the interval for accessing the memory, from the host computer via the first and third registers, and wherein said writing the decoded data to the memory includes accessing the memory with the decoder in accordance with the count value.

11. The method according to claim 7, further comprising:
designating the third register as a destination for the command and data sent from the host computer with the first register when the command is in the second state.

* * * * *